United States Patent [19]
Butera et al.

[11] Patent Number: 5,310,039
[45] Date of Patent: May 10, 1994

[54] APPARATUS FOR EFFICIENT TRANSFER OF ELECTRONIC DEVICES

[75] Inventors: Richard R. Butera, Palo Alto; Robert S. Childress, Sunnyvale; Amin Heydarpour, Mountain View, all of Calif.; Jagdish Sagar, Chandler, Ariz.

[73] Assignee: Intel Corporation, Santa Clara, Calif.

[21] Appl. No.: 932,656

[22] Filed: Aug. 19, 1992

[51] Int. Cl.5 .............................................. B65G 37/00
[52] U.S. Cl. ................................ 198/346.2; 198/468.6; 414/225
[58] Field of Search ............... 198/345.1, 346.2, 468.6, 198/468.2; 414/222, 225

[56] References Cited
U.S. PATENT DOCUMENTS

| | | | |
|---|---|---|---|
| 4,638,904 | 1/1987 | Randar et al. | 198/468.2 |
| 4,691,817 | 9/1987 | Haar | 198/468.2 |
| 4,770,120 | 9/1988 | Komatsu et al. | 198/345.1 X |

*Primary Examiner*—D. Glenn Dayoan
*Attorney, Agent, or Firm*—Blakely, Sokoloff, Taylor & Zafman

[57] ABSTRACT

An apparatus for the fast and efficient transfer of integrated circuits between three locations: an input location, a test site location, and an output location. The apparatus includes a front and a rear work press assembly for transferring integrated circuits between the locations and for applying pressure during testing. The work press assemblies is constructed of a variable length shaft coupled to an arm extension which is coupled to a work press. The work press assemblies can each move between three horizontal positions, a first horizontal position associated with the input location, a second horizontal position associated with the test site location, and a third horizontal position associated with the output location. The work press assemblies move independently of one another. While one work press assembly is applying pressure to an integrated circuit during testing at the test site location, the other work press assembly is transferring a tested integrated to the output location and then move back past the test site location to the input location to pick up an untested integrated circuit. The work press assemblies each move horizontally in a separate but parallel planes to one another so that they may pass each other without colliding.

15 Claims, 12 Drawing Sheets

APPARATUS FOR EFFICIENT TRANSFER OF ELECTRONIC DEVICES

BACKGROUND OF THE INVENTION

1. Field of the Invention

The present invention relates to the field of semiconductor test equipment, and more specifically to an apparatus for the fast and efficient transferring of integrated circuits between three locations: an input location, a test site location, and an output location where tested IC's are sorted according to test results.

2. Prior Art

Once fabricated, integrated circuits must undergo a plurality of tests to determine the circuits reliability and electrical characteristics. An apparatus such as the TES tri-temp SMD Handler model IPS-8990 is used in the prior art to transfer integrated circuit to and from a test location. Relevant parts of the apparatus are shown in FIG. 1.

Integrated circuits to be tested are stored in a tray 12. A pick and place assembly 14 loads a specified integrated circuit 13 from the input tray 12 and places it into the load slide 16. The loadslide then moves to the right and transfers the IC from the input chamber to the test chamber 18. Located in the test chamber 18 of the JLSI handler are three assemblies, a left pick and place assembly 20 and a middle pick and place assembly 22, and a work press assembly 24. The left pick and place assembly 20 moves integrated circuits from the load slide 16 to a turntable location 26 of turntable 28. A plurality (the exact number depends on the specific product) of integrated circuits may be stored in turntable 28 at any one time. Once an integrated circuit is loaded into turntable 28 at location 26, it is either heated or cooled so that testing may take place at an elevated or lowered temperature. The integrated circuit 13 is heated or cooled as it makes a revolution in turntable 28. Once the integrated circuit 13 has made a full revolution in turntable 28 and arrives once again at location 26, it is transferred by middle pick and place assembly 22 to test site location 30. At test site location 30 is a tester, such as a Trillium tester which conducts the actual electrical tests and characterization of the integrated circuit.

The middle pick and place assembly 22 only provides the integrated circuit to test site 30 from the turntable 28. Work press assembly 24 applies pressure to the integrated circuit 13 while it is being tested at test site location 30. Such pressure is necessary to carry out the test. Once testing is completed, work press assembly 24 transfers the integrated circuit 13 to the unload slide 32 where it is transferred from test chamber 18 and into storage area (output chamber) 34. In storage area 34 the integrated circuit is removed from the unload slide 32 by pick and place assembly 36 and placed into one of several storage bins 38. The integrated circuit is sorted depending upon its electrical characteristics. Once placed in the storage tray 38 the I.C. has completed its testing.

FIGS. 2(a-e) illustrate how integrated circuits are inefficiently transferred between locations in the test chamber by the prior art handler. FIG. 2a is a side view of test chamber 18 of the handler. Shown are the two pick and place assemblies 20 and 22 and the one work press assembly 24. It is important to note that the three assemblies 20, 22, and 24 are rigidly coupled to one another. Each of the assemblies is a fixed distance (four inches) from one another. The assemblies are fixed together as a single apparatus 42. The apparatus 42 resides in a single plane and slides in a horizontal direction on guide shaft 4. Also shown in FIG. 2a are the four IC locations within the test chamber 18 of the handler: the load slide 16 location, the turntable 26 location, the test site location 30, and unload slide 32 location. Each of these locations lie in a single plane and like the assemblies 20, 22, and 24 are spaced four inches apart from one another. Integrated circuits are moved by the assemblies 20, 22, and 24 between the locations in the test chamber 18.

FIG. 2a details the position of the assemblies at the start of a test cycle. At the start of the cycle it is assumed that the test pipeline is full of integrated circuits so that there is an integrated circuit at each of the four locations and the turntable has a full compliment of integrated circuits. At the start of the test cycle, work press assembly 24 has an integrated circuit A which has just completed testing in Trillium tester located at the test site 30. The middle pick and place assembly 22 has an integrated circuit B which has just completed a heating rotation in turntable 28, and the left pick and place assembly has an integrated circuit C from load slide 16.

During time T1 the entire apparatus 42 which includes assemblies 20, 22, and 24 slides over horizontally four inches as shown in FIG. 2b. In this way the left pick and place 20 holding integrated circuit C is positioned over the turntable at turntable location 26. Middle pick and place 22 holding integrated circuit B is positioned over test site location 30 and work press assembly 24 holding integrated circuit A is positioned over the unload slide 32.

During time T2 individual assemblies of the apparatus 42 move to the position illustrated in FIG. 2c. During time T2 the apparatus 42 remains in the position illustrated in FIG. 2b, however, the middle pick and place and the left pick and place change their respective positions in the vertical direction. The left pick and place 20 lengthens its shaft such that integrated circuit C can be placed at turntable location 26. Middle pick and place 22 lengthens its shaft so that untested integrated circuit B can be placed down into the test site well 30 for testing. The work press 24 places tested integrated circuit A into unload slide 32. Also during time T2, after the integrated circuits have been placed in their respective positions, each of the assemblies shortens its shaft length so that the apparatus 42 may slide on guide shaft 40 back four inches to its original position. It is important to note that integrated circuit B is not tested at this time. In order to test an integrated circuit the work press assembly 24 must be available to apply pressure to the integrated circuit during testing.

During time T3 the apparatus 42 slides back to the initial position as illustrated in FIG. 2d. While the apparatus 42 slides from the second position four inches back to the initial position, neither the pick and place assemblies 20 and 22 nor the work press assembly 24 is carrying an integrated circuit. Also during T3 turntable 28 rotates one position so that a new integrated circuit C', which has undergone heat treatment, is now available at turntable location 26. Also at this time, a new integrated circuit, circuit D, moves on load slide 16 from the input chamber to the test chamber 18.

During time T4 integrated circuit B is finally tested as illustrated in FIG. 2e. At the beginning of time T4 each of the shafts of the assemblies lengthen. The left pick and place 20 lengthens to pick integrated circuit D which recently moved into the test area on load slide 16. The middle pick and place 22 lengthens its shaft to pick up integrated circuit C' which has recently completed its heat or cold treatment rotation in turntable 28. The work press 24 lengthens its shaft so that it can apply pressure to integrated circuit B while it is being tested by the Trillium tester at the test site location 30. The work press assembly 24 applies pressure to integrated circuit B during the entire course of testing. The actual testing time can vary in length depending upon the complexity of the integrated circuit and the types of tests conducted. During the entire test time, the apparatus 42 remains in the horizontal position as shown in FIG. 2e. During testing pick and place assemblies shorten their respective shafts to the up position. Once testing of integrated circuit B has completed, work press assembly 24 shortens its shaft. The apparatus is now back to the position as shown in FIG. 2a. The test cycle is complete at this time.

Integrated circuits continue to be serially manipulated in the above fashion. The total time required for a single test cycle is Ttotal=T1+T2+T3+T4. The total test handler cycle time can be broken into two parts, the index time and the actual test time. The index time is the time required to transfer parts between the different locations while the Trillium tester is not testing integrated circuits (i.e. the time from the end of the test to start of test). In the prior art the index time is (T1+T2+T3+T4-the test time) which is approximately 3.2 seconds. The actual test time of an integrated circuit for a part varies from 2 to 20 seconds depending upon the types of tests and the complexity of the circuit. Unfortunately, during the index time of the test cycle the testing apparatus (trillium tester) sits idle.

Testing machines, such as Trillium testers, are extremely expensive. It is, therefore, beneficial to reduce the index time of handlers as much as possible so that expensive testing machines may be utilized more efficiently.

Thus what is needed is a method and apparatus to efficiently transfer integrated circuits to and from a tester so that the tester can spend more time testing and less time sitting idle.

SUMMARY OF THE INVENTION

An apparatus for the fast and efficient transfer of integrated circuits between four locations, a load slide location, a turn table location, a test site location and an unload slide location, wherein each of the four locations reside in a first XY plane.

The apparatus has a first and a second work press assembly which transfer integrated circuits between the second, third, and fourth locations. The work press assemblies also apply pressure to integrated circuits while they are being tested by a testing machine at the third location. Each of the work press assemblies has a variable length shaft comprising a 1.5 inch pneumatic cylinder and a 6 inch pneumatic cylinder, and a rigid member. The variable length shafts have three vertical lengths which are signaled by three electronic sensors. Rigidly coupled perpendicular to the variable length shaft of each work press assembly is an arm extension. Coupled to each arm extension is a work press including suction cup for picking up and applying pressure to integrated circuits.

The first and second work press assembles each move independently of one another in parallel planes. The work press assemblies are each moved between the second, third and fourth locations by two four inch pneumatic cylinders. The work press assemblies are capable of moving from the fourth location to the second location while the other work press assembly is at the third location applying pressure to parts. The work press assemblies locations are each signaled by one of three electronic sensors.

The apparatus also has a pick and place assembly for transferring parts between the first and second locations. A single four inch pneumatic cylinder along with two electronic sensor provide movement between the two locations. The pick and place assembly has three vertical positions, one for moving between locations and the other two for picking up and placing parts at the first and second locations. The vertical positions of the pick and place assembly are achieved with dual pneumatic cylinders.

The first and second work press assembles and the pick and place assembly each move independently in a coordinated predefined manner to efficiently transfer integrated circuit components between the four locations. A digital computer controls the movement of each of the assemblies. A routine may be added to the computer program which controls the movement of the work press assemblies in order to monitor the speed of the movement of the work press assemblies.

A goal of the present invention is to efficiently transfer electronic components between four locations. In this way a testing apparatus at the third location may be almost continually utilized. This goal is achieved by the ability of the work press assemblies to go from the fourth location to the second location pass the third location while the other work press assembly is testing a device at the third location.

Another goal of the present invention is to provide an apparatus which may easily fit into an existing TES test handler apparatus.

Other features and advantages of the present invention will become apparent in the detailed description which follows.

DETAILED DESCRIPTION OF THE PRESENT INVENTION

The present invention discloses a novel method and apparatus for the fast, efficient, and parallel transfer of integrated circuits to and from a test site location. In the following description numerous specific details are set forth such as cylinder types and sizes in order to provide a thorough understanding of the present invention. However, it will be obvious to one skilled in the art that the present invention may be practiced without these specific details. In other instances well-known mechanical requirements and handling techniques have not been set forth in detail in order to not unnecessarily obscure the present invention.

The present invention is a method and apparatus for the fast, efficient, and parallel transfer of integrated circuits to and from a test site. The apparatus of the present invention can be easily implemented into existing TES integrated circuit handlers such as the TES tri-temp SMD Handler Model IPS-8990. The novel method and apparatus of the present invention can provide untested integrated circuits to a testing apparatus, such as a Trillium tester, and remove tested integrated circuits from the tester in such a manner that the testing apparatus is almost continually used.

Figure 1:
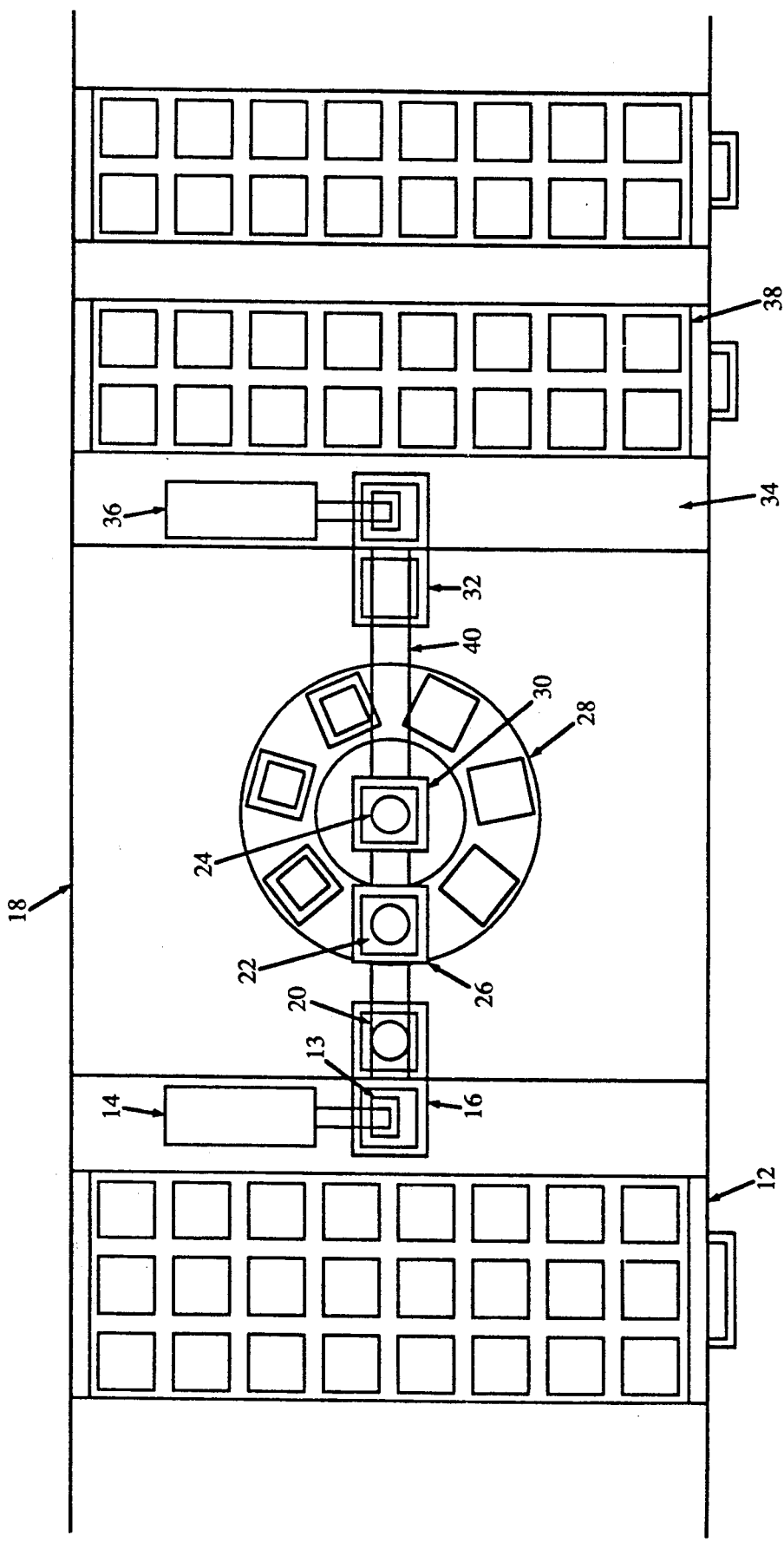
FIG. 1 is an overhead view of an illustration of a prior art integrated circuit handler.
Figure 2A:
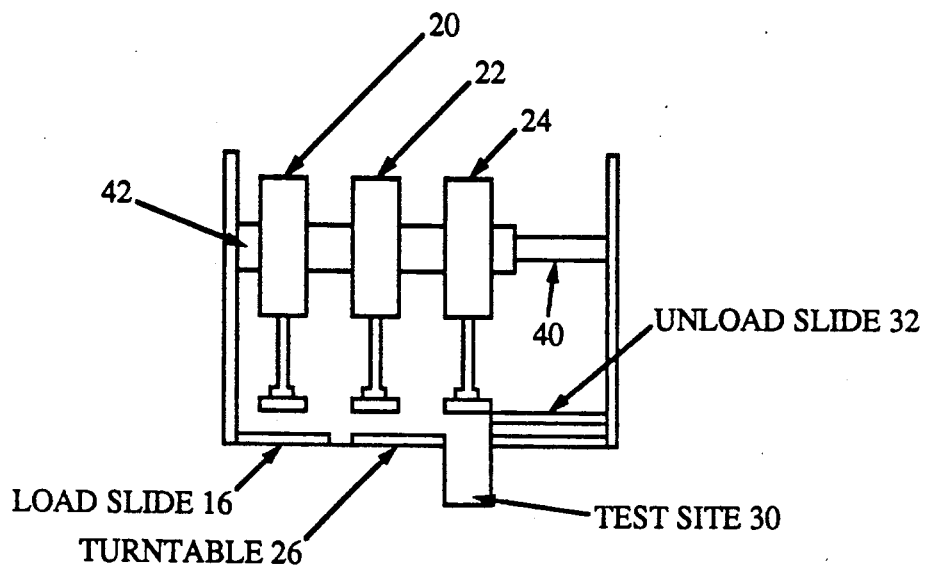
FIG. 2(a-e) are side views of a prior art integrated circuit handler illustrating the transferring of integrated circuits between locations by the handler.
Figure 2B:
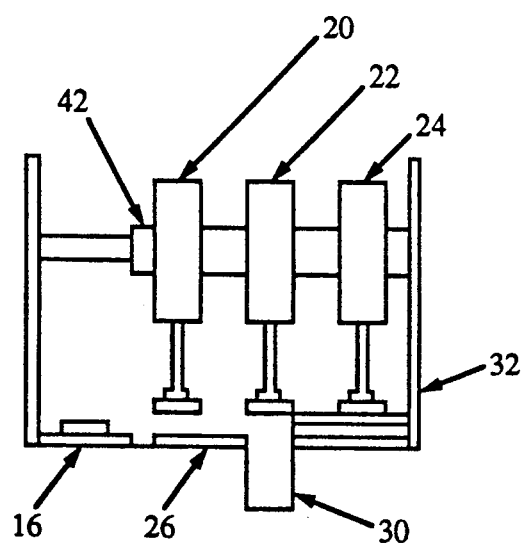
Figure 2C:
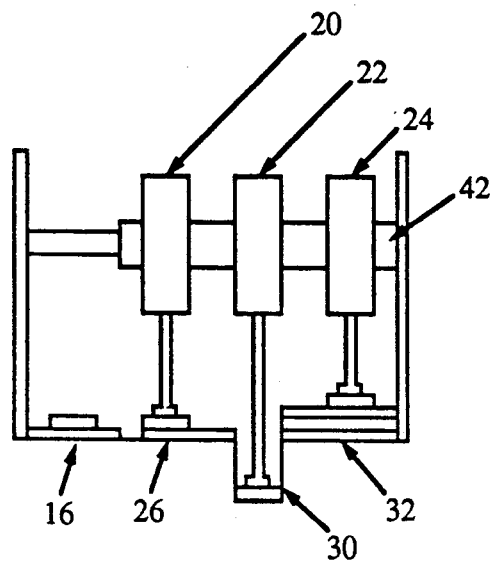
Figure 2D:
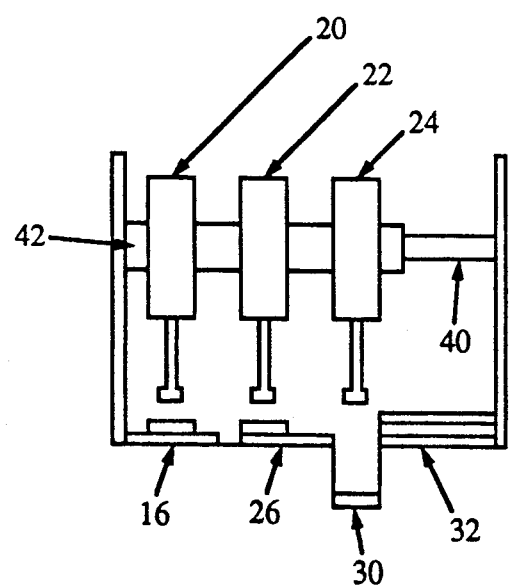
Figure 2E:
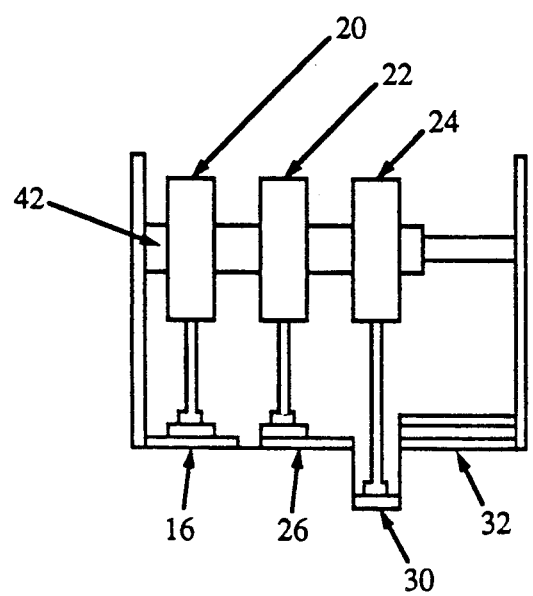
Figure 3:
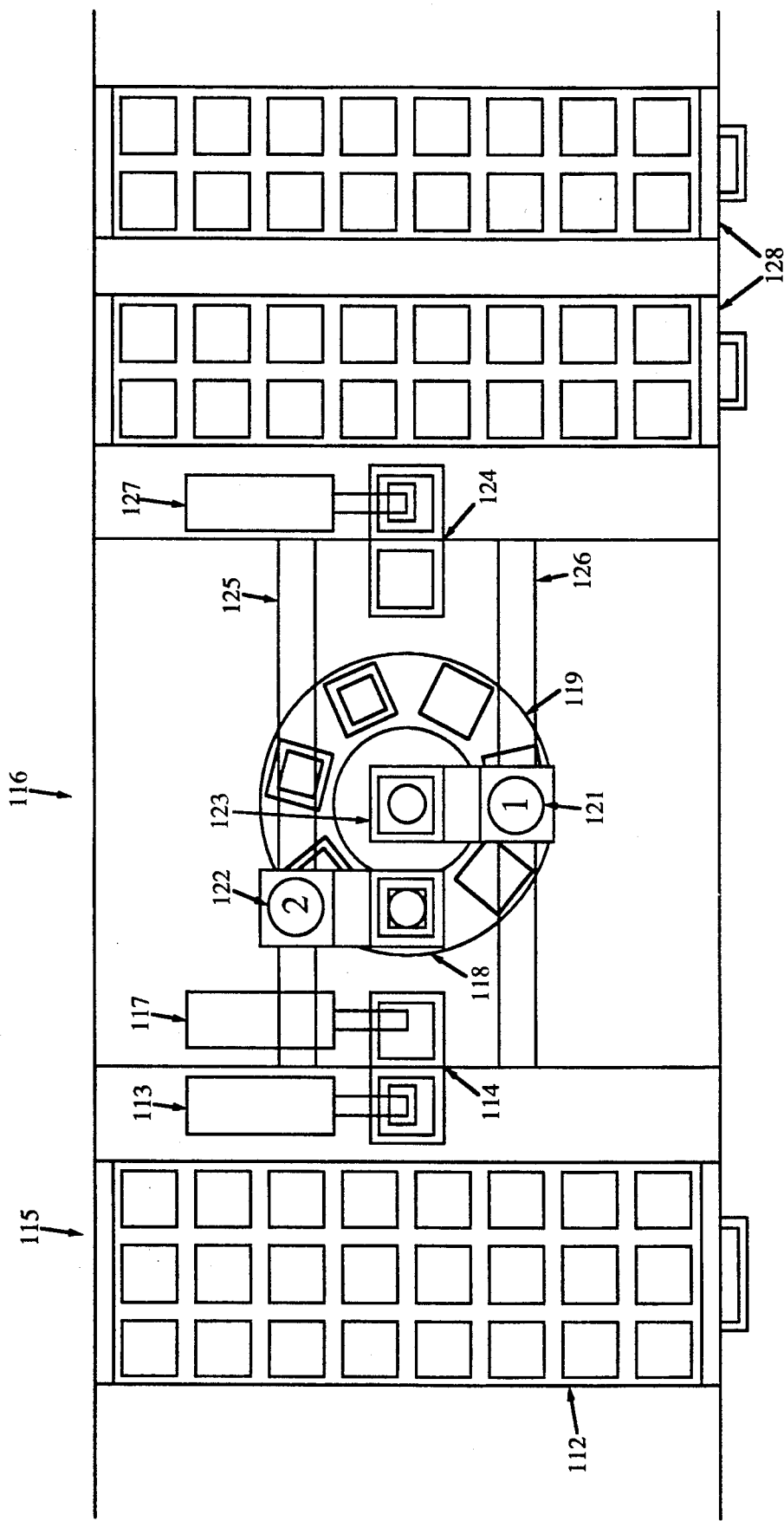
FIG. 3 is an overhead view of an illustration of the apparatus of the present invention for efficiently transferring integrated circuits to and from a test site.

An overhead view of a handler in which the present invention is implemented is shown in FIG. 3. The apparatus can be easily fitted into the test chamber 116 of existing handlers. A tray 112 holds integrated circuits to be tested by an electrical test machine such as a Trillium tester. An input pick and place 113 transfers untested integrated circuits from tray 112 to load slide 114, one at a time. The integrated circuit moves from the input chamber 115 to the test chamber 116 on load slide 114.

A pick and place assembly 117 is used to transfer integrated circuits from the load slide 114 to a location 118 of turntable 119. Pick and place 117 is attached to a guide shaft (not shown) located over the right side of load slide of load 114 and location 118 of turntable 119. Pick and place assembly 117 has two allowable horizontal positions, one over the load slide 114 and one over location 118 of turntable 119.

Turntable 119 is standard in most integrated circuit test handlers. Turntable 119 provides means for heating or cooling integrated circuits before testing. In this way integrated circuits are tested under stressed conditions which is useful for reliability testing. Integrated circuits are provided to turntable 119 at location 118 by pick and place 117. A plurality of integrated circuits are contained in turntable 119 at any one time (the exact number depends on the size of the particular integrated circuit). The turntable 119 rotates to provide newly heated or cooled integrated circuits as required.

In the present invention two work press assemblies are provided, a front work press assembly 121 and a rear work press assembly 122. (In the prior art handlers only a single work press is provided). Work press assemblies 121 and 122 each are capable of moving horizontally to three positions. A first position associated with turntable location 118, a second position associated with test site location 123, and a third position associated with the unload slide 124. The front work press assembly 121 slides horizontally between positions on guide bar 126. Rear work press assembly 122 slides horizontally between the three positions on guide bar 125. The horizontal movement of front and back work press assemblies 121 and 122 are, unlike the prior art, independent of one another. In this way, one work press can move while the other is stationary.

Integrated circuits are transferred alternately by front and back work press assemblies from turntable location 118 to test site location 123 where their electrical characteristics are tested by an integrated circuit test machine. In the present invention, the integrated circuits are tested by a Trillium tester, but any of a variety of well known testers may be utilized. Tested integrated circuits are transferred to an unload slide 124 where they are removed from the test chamber 116. A pick and place 127 removes tested integrated circuits from the right-hand side of unload slide 124 and transfers them into one of a plurality of output trays or bins 128. The tested integrated circuits are normally sorted by results of the electrical test conducted by the Trillium tester.

In reference to FIG. 4, the front and back work press assemblies 121 and 122, each have three different vertical positions in order to pick up integrated circuits at the various locations. The three different vertical positions of the work press assemblies are accomplished by providing a variable length shaft for each of the work press assemblies. The variable length shafts are each formed by coupling together two pneumatic cylinders and a rigid member. In reference to back work press assembly 122, the first pneumatic cylinder 131 is a one and a half inch stroke cylinder and the second pneumatic cylinder 132 is a six inch stroke cylinder. The rigid member is formed from three parallel rods.

Figure 4A:
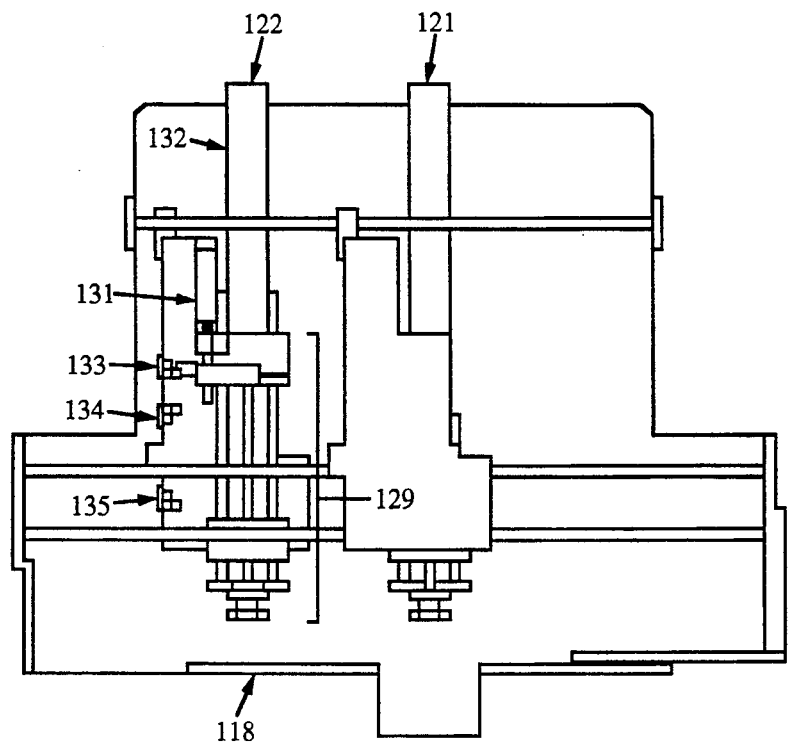
FIG. 4a is an illustration of the rear work press assembly in the up position at the location associated with the turntable and front work press assembly in the up position at the location associated with the test site.
Figure 4B:
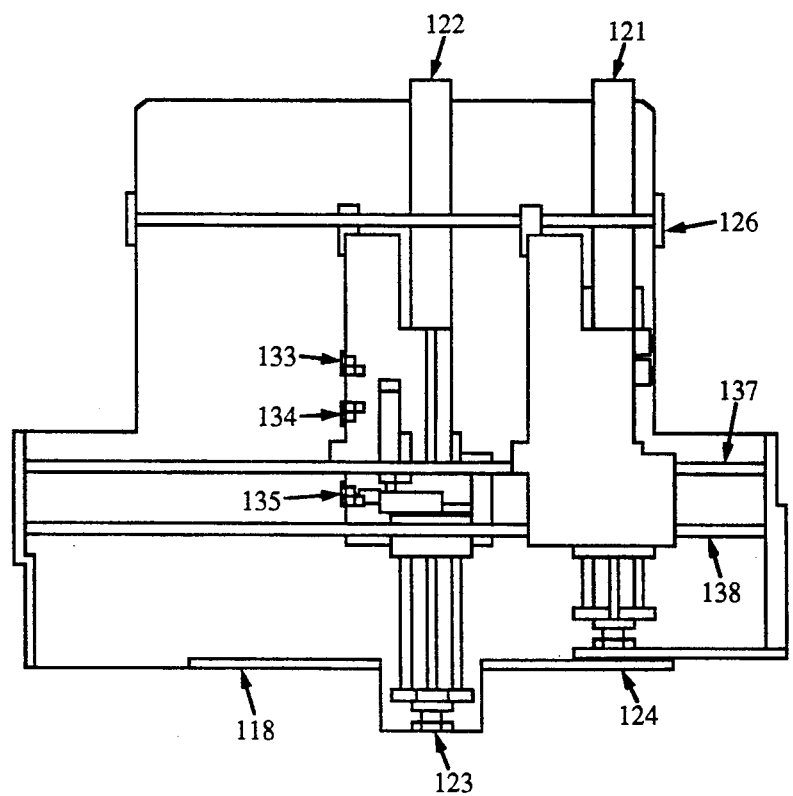
FIG. 4b is an illustration of the rear work press assembly in the third lowered position at the location associated with the test site and front work press assembly in the up position at the location associated with the unload slide.
Figure 4C:
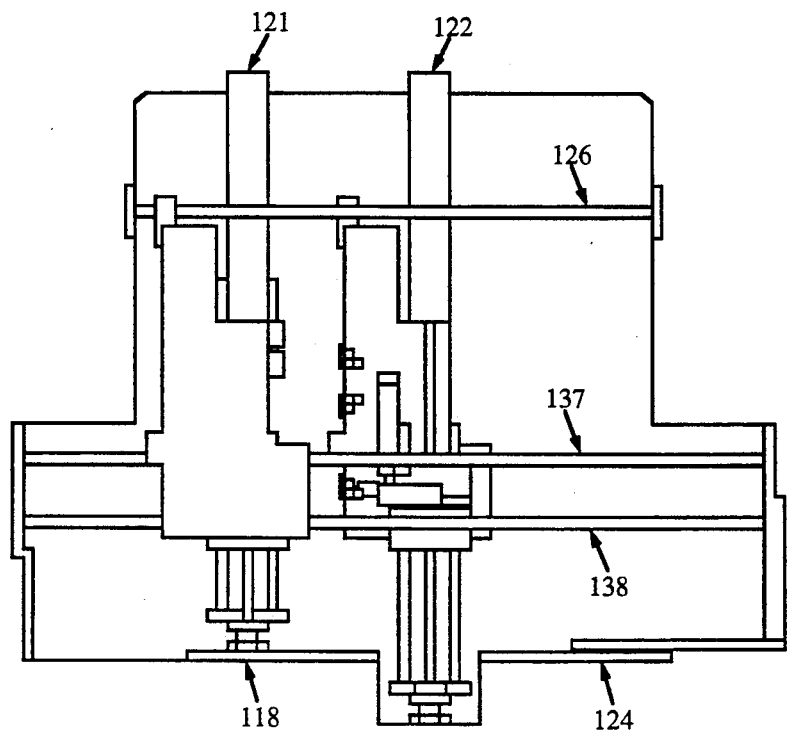
FIG. 4c is an illustration of the front work press assembly in the middle position at a location associated with the turntable and rear work press assembly in the lowered position at a location associated with the test site.

The variable length shaft has a first shaft length which is used for placing integrated circuits into the unload slide 24 and for traveling between the three horizontal positions. This length is the shortest length of the variable length shaft. To obtain this length both cylinders 131 and 132 are closed as shown in FIG. 4a. A third shaft length is used for placing integrated circuits into the test site location and for applying the required pressure on the integrated circuit while it is being tested. The third shaft length is the longest shaft length of the variable length shaft and is achieved by closing cylinder 131 and opening six inch cylinder 132 as shown in FIG. 4b. A second middle length is provided for picking up integrated circuits from the turntable location 118. This length, as shown in FIG. 4f, is achieved by opening the one and a half inch cylinder 131 and closing the six inch cylinder 132. Each of the pneumatic cylinders is opened and closed by air pressure supplied to the cylinders. As is well known in the art, the air pressure to the cylinders is controlled by a digital computer which controls the operation of the handler.

The three allowable lengths of the variable length shafts are checked by electronic sensors. Three electronic sensors are provided on each work press assembly 121 and 122 as shown in FIG. 4a. Electronic sensor 133 signals when the shaft 119 has the first length (i.e., when the shaft is in the up position). Electronic sensor 134 signals when variable length shaft 129 has the second length (i.e., when the shaft is in the up position). Electronic sensor 135 signals when the variable length shaft 129 has the third length (i.e., when the shaft is in the down position). Although not shown, front work press assembly 121 has equivalent electronic sensors for signaling its respective shaft length. Additionally, pick and place assembly 117 has three sensors which signal its respective lengths.

Figure 5A:
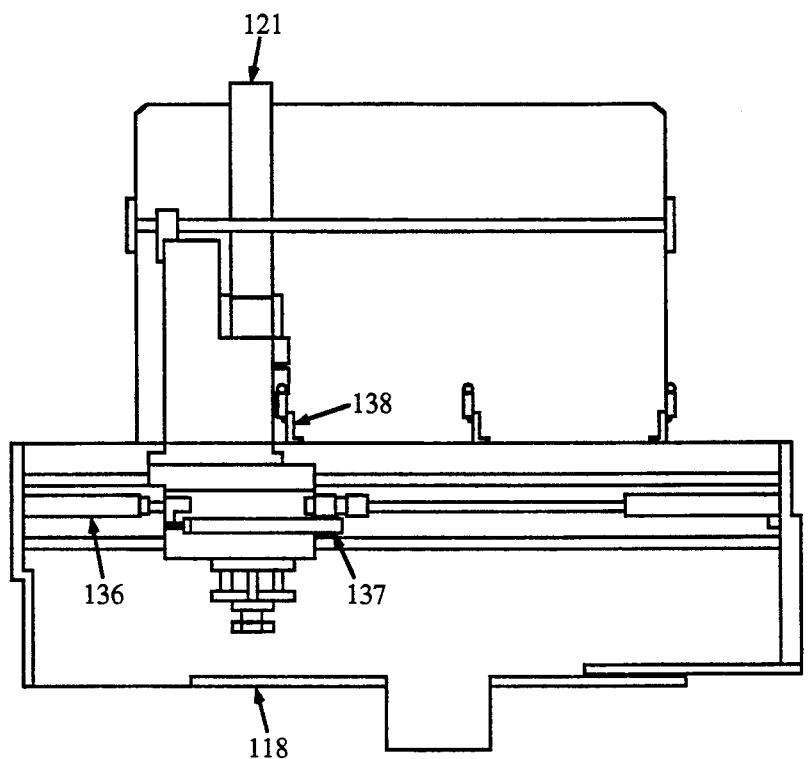
FIG. 5a is an illustration of the front work press assembly in the up position at a location associated with the turntable wherein the first and second pneumatic cylinders are closed.

The three horizontal positions of each of the work press assemblies 121 and 122 are achieved in the present invention with two cylinders and three sensors. In reference to FIG. 5a, the front work press assembly is shown in a horizontal position associated with the turntable location 118. In this position the first cylinder 136 and the second cylinder 137 are both closed. The fact that the work press assembly is located in this position is signaled by electronic sensor 138.

Figure 5B:
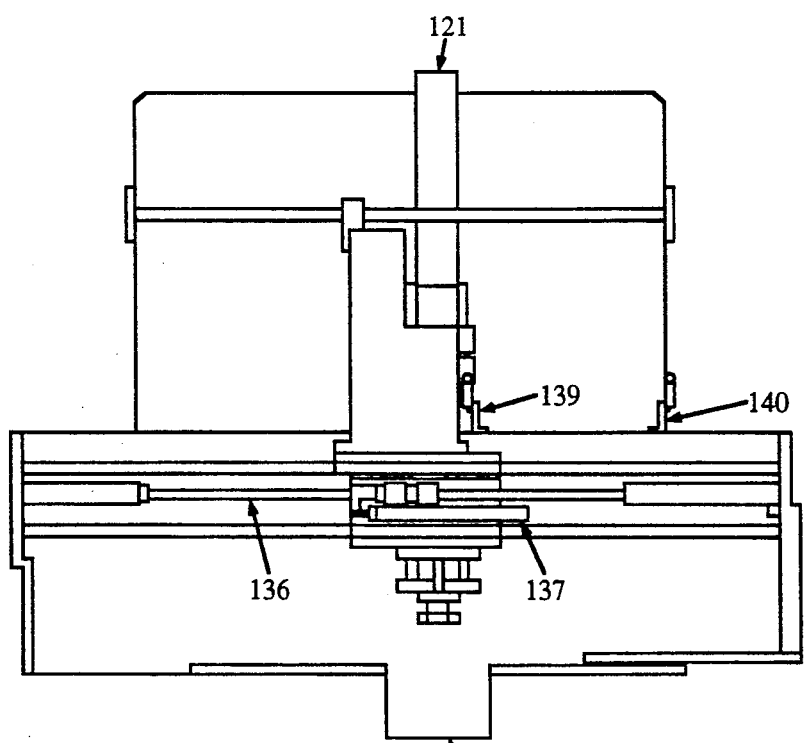
FIG. 5b is an illustration of the front work press assembly in the up position at a location associated with the test site wherein the first pneumatic is open and the second pneumatic is closed.

In FIG. 5b the front work press assembly 121 is shown in the horizontal position associated with test site location 123. In this position, the first pneumatic cylinder 136 is open while the second pneumatic cylinder 137 is closed. Electronic sensor 139 signals when work press assembly 121 is in the position associated with the test site location 123.

Figure 5C:
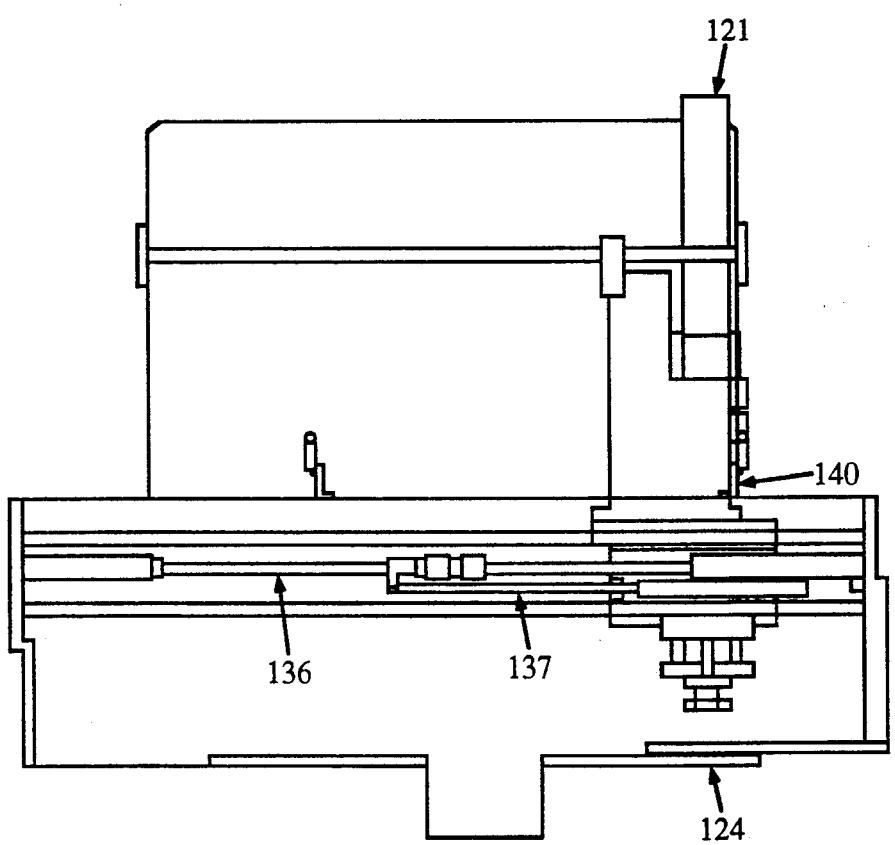
FIG. 5c is an illustration of the front work press assembly in the up position at a location associated with the unload slide wherein the first and second pneumatic cylinders are both open.

In FIG. 5c the front work press assembly 121 is shown in the third and final position; the position associated with unload slide 124. When the work press assembly is in this position both pneumatic cylinders 136 and 137 are open. A sensor 140 signals when the work press assembly is in this third position. In the present invention the horizontal cylinders 136 and 137 are each four inch stroke pneumatic cylinders. The sizes of the cylinders may be varied depending upon the distance required in the specific application. Although the movement of rear work press assembly 122 has not been shown, its manipulation by electronic sensors and pneumatic cylinders is the same as front work press assembly 121.

Pick and place assembly 117 works on the same principles as the work press assemblies 121 and 122 except that it has three vertical positions and only two horizontal position. The pick and place assembly 117 slides on guide bars between two horizontal positions, one above the load slide 114 and one above the turntable location 118. A single four inch pneumatic cylinder is provided for moving the pick and place assembly 117 between its two horizontal positions. Pick and place assembly 117 has three vertical positions: an up position used for sliding between the two horizontal positions, a down position used for picking up parts with its suction cup at the load slide, and the middle position for dropping IC's into the turntable location 118. In order to prevent damage to the leads of an integrated circuit, the pick and place assembly 117 drops parts into the turntable location 118 from a height slightly above the turntable.

Figure 6C:
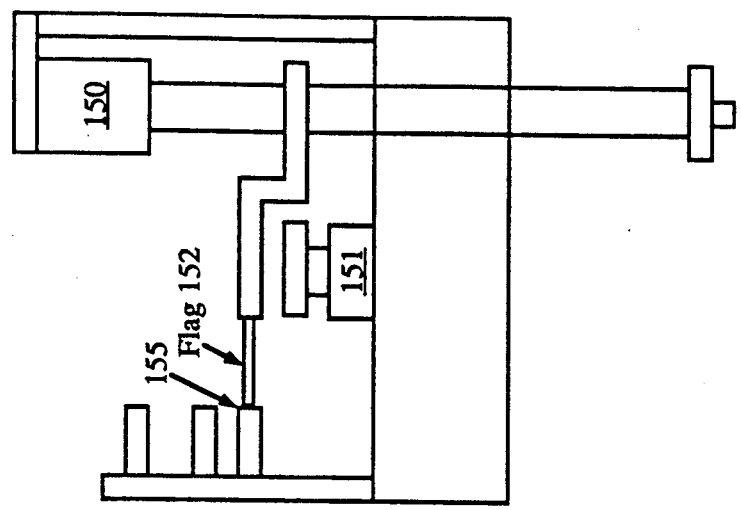
FIG. 6c is an illustration of the pick and place assembly in the down vertical position.
Figure 6B:
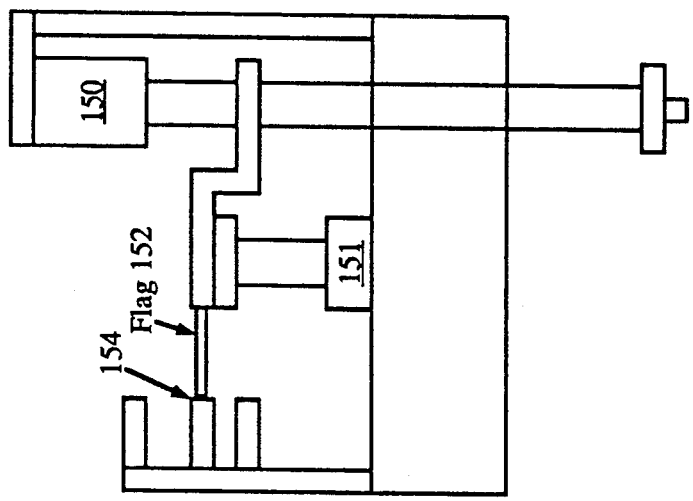
FIG. 6b is an illustration of the pick and place assembly in the middle vertical position.
Figure 6A:
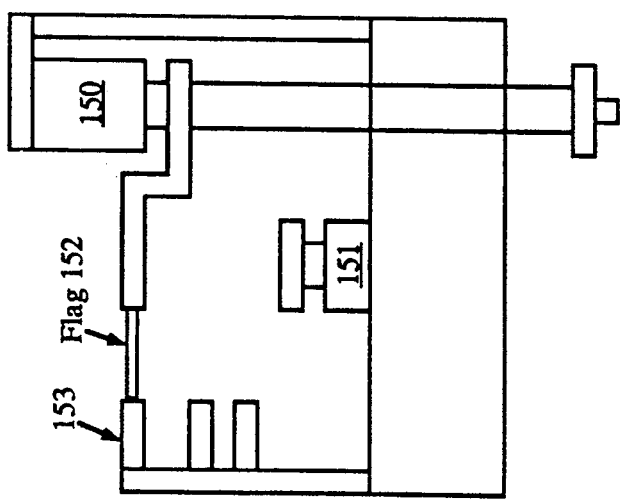
FIG. 6a is an illustration of the pick and place assembly in the up vertical position.

The three vertical positions of the pick and place assembly 117 are generated with two pneumatic cylinders, a 1½ inch stroke cylinder and a ¼ inch stroke cylinder. As shown in FIG. 6a, the up position of pick and place assembly 117 is achieved by closing the 1½ inch stroke cylinder 150 and closing the ¼ inch stroke cylinder 151. The fact that the pick and place 117 is in the up position is signaled by the coupling of flag 152 to sensor 153. As shown in FIG. 6b the middle vertical position of the pick and place assembly 117 is achieved by opening the ¼ inch stroke cylinder 151 and opening the 1½ inch stroke cylinder 150. The ¼ inch stroke cylinder 151 acts as a mechanical stop to prevent the shaft of pick and place 117 from going all the way down. The middle vertical position is signaled by the coupling of flag 152 to sensor 154. As shown in FIG. 6c the down vertical position of the pick and place assembly 117 is achieved by closing the ¼ inch stroke cylinder 151 and opening the 1½ inch stroke cylinder 150. The fact that the pick and place assembly 117 is in the down position is signaled by the coupling of flag 152 to sensor 155. It is to be noted that the remaining features of the pick and place assembly 117 are the same as the prior art pick and place assemblies which are well known in the art.

Figure 7:
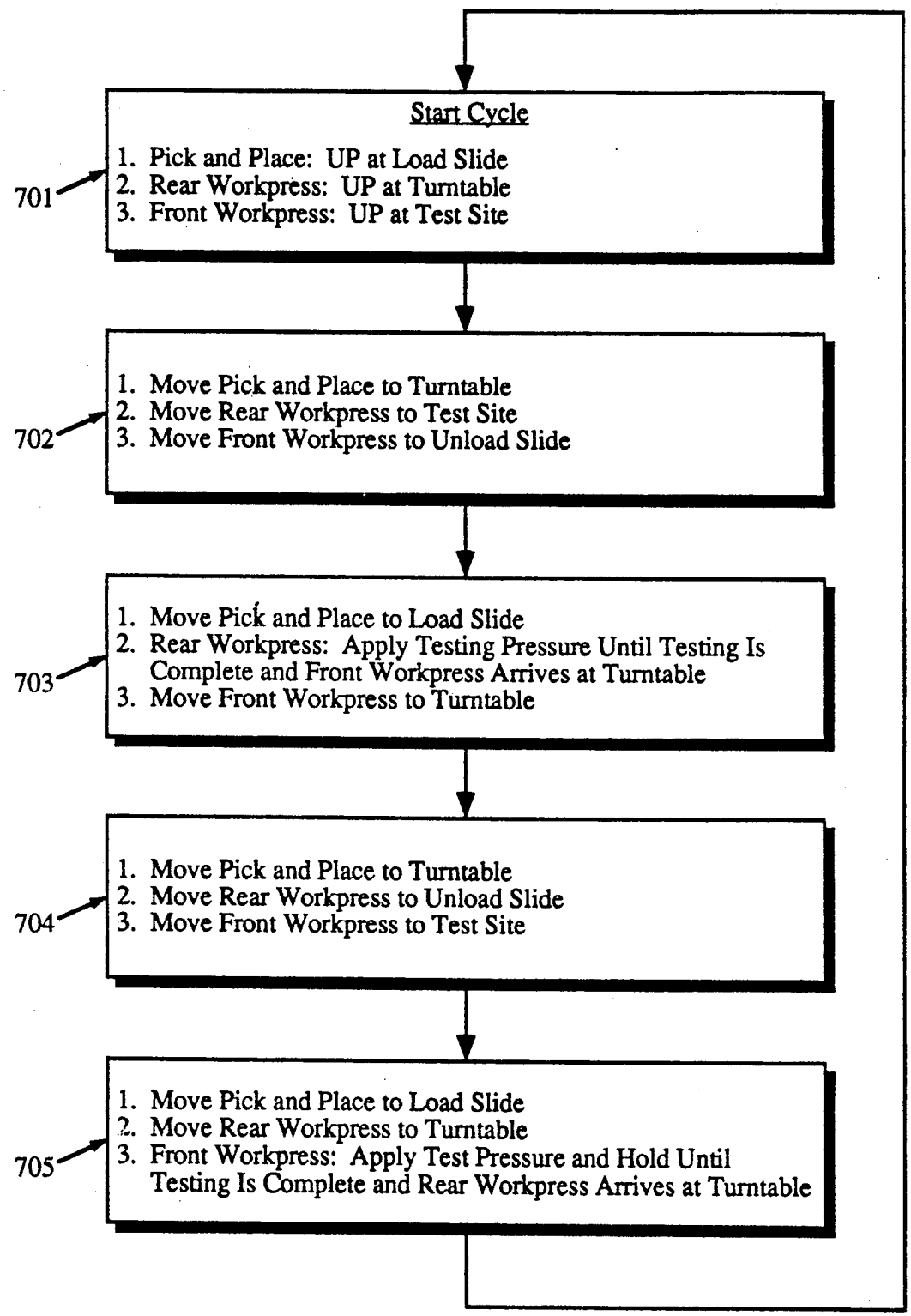
FIG. 7 is a flow diagram illustrating the method of movement of the first and second work press assemblies and the pick and place assembly.

The method in which the apparatus of the present invention transfers integrated circuits between locations is illustrated in the flow diagram of FIG. 7. The method is illustrated in conjunction with FIGS. 4a–4f.

In block 701 of FIG. 7, the apparatus of the present invention is in the arbitrary start position as shown in FIG. 4a. For illustrative purposes it is assumed there is a ready supply of untested integrated circuits in tray 112 located at the input side of the handler. It is also assumed that turntable 119 is already loaded with the full complement of heated or cooled, untested integrated circuits. We also assume that front work press assembly 121 has just completed the testing of an integrated circuit. In block 701 of FIG. 7 the rear work press assembly 122 is at the position associated with turntable location 118 and its variable length shaft 129 has the shortest length or is in the up position. Rear work press assembly 122 has an integrated circuit recently removed from turntable 119. Front work press assembly 123 at this time is in the position associated with the test site location, and is also in the up position, and has an integrated circuit which has recently been tested by Trillium tester. Also at this time, but not shown in FIG. 4a, pick and place assembly 117 is located in the up position over load slide 114 and has an untested and unheated integrated circuit.

Block 702 of FIG. 7 illustrates the movement of the assemblies during time T1. As shown in FIG. 4b front work press assembly 121 slides on guide bars 126, 137, and 138 to a position associated with the unload slide 124. Guide bars 137 and 138 which are parallel to guide bar 126 provide added stabilization for the front work press assembly. A tested integrated circuit is deposited on unload slide 124 from where it is removed from the test chamber and sorted by its electrical characteristics. Also at this time, but under independent action, rear work press assembly 122 moves over to its second position, the position associated with test site location 123. Rear work press assembly 122 slides horizontally on three parallel guide bars 125, 139, and 140 (not shown). Rear work press assembly 122 then lengthens its shaft to the third vertical position and places a heated or cooled, but untested integrated circuit into test site 123. At test site 123 there is a Trillum tester for testing and recording the electrical characteristics of integrated circuits. Also at this time and under independent action pick and place assembly 117 slides over to the horizontal position over the turntable, lowers to the middle vertical position and drops an untested and unheated integrated circuit into turntable 119 at location 118 which is presently vacant.

Block 703 illustrates the movement of the apparatus of the present invention during time T2. At this time a plurality of tests are conducted on the integrated circuit at test site location 123. Rear work press assembly 122 applies pressure to the integrated circuit so that it can be tested. Careful attention must be given to the amount of pressure provided by rear work press assembly 122 to the integrated circuit so that the integrated circuit's leads are not damaged. As shown in FIG. 4c, while the rear work press assembly 121 is in the third position, the lowered position, applying pressure to the integrated circuit being tested, front work press assembly 121 slides in the up position on guide bars 126, 137, and 138 to the position associated with turntable location 118, where it lowers to its middle vertical position and retrieves a heated but untested integrated circuit, and then raises to the up position. Front work press assembly 121 raises to the up position when testing is complete.

Figure 4D:
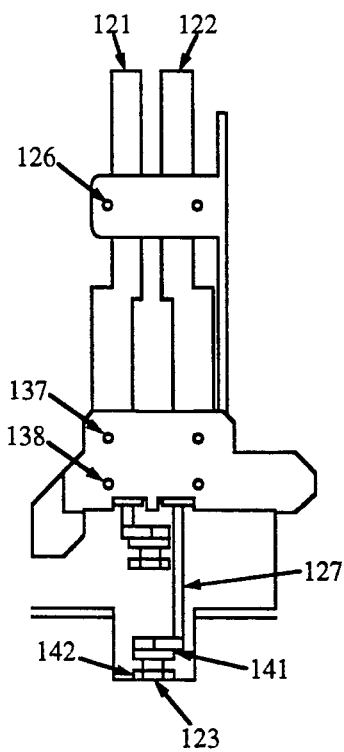
FIG. 4d is an illustration of the crossing of the work press assemblies while rear work press assembly is in the lowered position at the test site location and front work press assembly is in the up position traveling past the test site location.

In reference to FIG. 4d the crossing of rear work press assembly and the front work press assembly is further detailed. Front and rear work press assemblies each have a unique "L" shape which allows them to pass unhindered when one arm is down in the test site and the other arm is up. Coupled perpendicularly to the rigid member 127 of variable length shaft 129 of the rear work press assembly 122 is an arm extension 141. Arm extension 141 positions the work press 142 (and its suction cup for picking up integrated circuits) over the test site 123. In this way, the shaft and other parts of the rear work press assembly 122 lie in a plane different than, but parallel to each of the IC locations. This allows the front work press assembly 121 to slide on guide bars 126, 137, and 138 from the position associated with the unload slide location, past the rear work press assembly at the test site, to the position associated with the turntable location without colliding into the rear work press assembly 122. The unique "L" shape allows the work press assemblies 121 and 122 to travel in separate parallel planes but yet allows them to each reach the integrated circuit locations. In this way, while an IC is being tested by one work press assembly the other work press assembly can simultaneously and independently move between locations 118 and 124. This feature drastically reduces the index time of the present invention. (It is to be stressed that all features of the work press assemblies of the present invention, except as noted herein, are essentially identical to the well known work press assemblies of the prior art.)

Normally the time required to test an integrated circuit is at least two seconds (the actual test time varies depending upon the complexity of the integrated circuit and actual tests conducted). Therefore, the time to test an integrated circuit in block 703 is normally the limiting factor for moving the assemblies to their next position. The testing time is sufficiently long to allow the front work press assembly to deposit the tested integrated circuit at the unload slide, and to slide past the test site location 123 to turntable location 114 while the rear work press assembly is still in the down position applying pressure to the integrated circuit.

If only simple tests are conducted by the tester for a product with a short test time, then it is conceivable that not enough time may elapse during testing to allow front work press assembly 122 to pass while rear work press assembly is in the down position. If the rear work press assembly 122 is in the up position while the front assembly 121 crosses the test site location the two arms of the work press assemblies would crash into one another. Therefore, as indicated in block 703 of the flow diagram of FIG. 6, if the front work press assembly 121 has not made it to the turntable location 118 before testing is complete, the rear work press assembly remains in the lowered position so that the front work press assembly can pass unhindered.

Also at this time, in block 703, pick and place assembly 117 moves in the up position from a position over turntable location 118 to a position over load slide 114. Once over load slide 114 the pick and place assembly moves to the down position and picks up a new untested and unheated integrated circuit with its suction cup and then raises to the up position. Also at this time turntable 119 rotates one position so that a new heated, untested integrated circuit is provided at location 118.

Figure 4E:
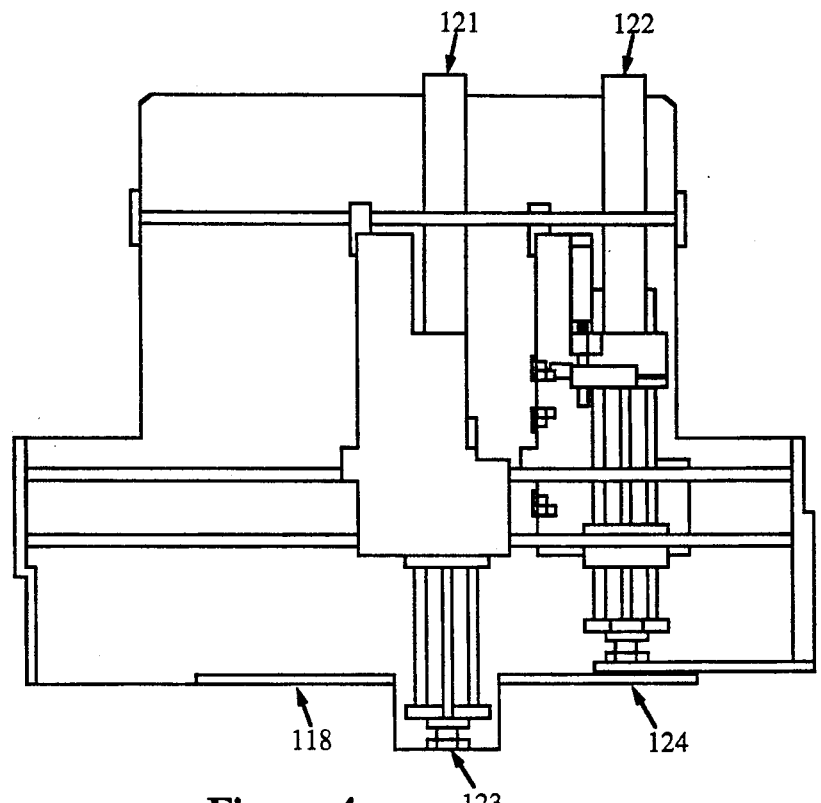
FIG. 4e is an illustration of the front work press assembly in the lowered position at the location associated with the test site and rear work press assembly in the up position at the location associated with the unload slide.
Figure 4F:
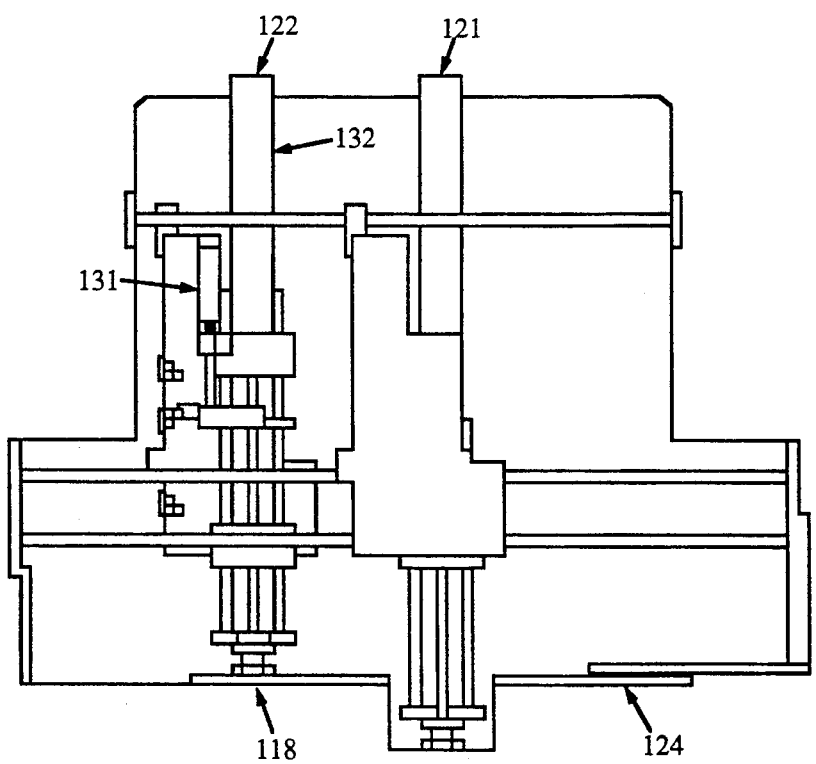
FIG. 4f is an illustration of the rear work press assembly at the middle position at a location associated with the turntable and front work press assembly at the lowered position at a location associated with the test site.

In block 704, as shown in FIG. 4e, after the rear work press assembly 122 has completed testing it grabs the tested integrated circuit, moves to the up position, and slides over to the position associated with the unload slide 124 where it deposits the tested integrated circuit. At the same time front work press assembly 121 slides over to the position associated with the test site location 123. The front work press assembly then lengthens its variable length shaft to the third vertical position and places an integrated circuit into the test site and applies the required pressure for testing. Also at this time pick and place assembly 117 (not shown) slides to the horizontal position over presently vacant turntable location 118, lowers to the middle vertical position, and drops an untested and unheated integrated circuit into turntable location 118.

In block 705 and as shown in FIG. 4e, an integrated circuit is tested while pressure is applied by the front work press assembly. During this time the turntable 119 spins one position to provide a heat treated, but untested integrated circuit at location 118. Also at this time the pick and place assembly 117 slides from a position over the turntable location 118 to a position over load slide 114. As shown in FIG. 4f, during testing of an integrated circuit, rear work press assembly 122 slides in the up position on its guide shafts from the unload slide location 124 to the turntable location 118, crossing over the test site location in the process. Again the unique "L" shape of the work press assemblies allows unhindered passing of the assemblies. Once at the position associated with the turntable location 118 the front work press assembly lowers to the middle vertical position and picks up an untested but heated integrated circuit and then raises to the up position. Once over load slide 114, pick and place assembly 117 lowers its shaft to the down vertical position, picks up an untested integrated circuit, and then shortens its shaft to the up vertical position. When testing of the present integrated circuit is complete and when rear work press assembly has made it to the turntable location 118 and picked up a new part, front work press assembly raises to the up position holding a tested integrated circuit. In this way the assemblies are once again in the initial position as shown in FIG. 4a. The process of FIG. 6 is continued until all integrated circuits located in tray 112 have been tested.

An advantage of the present invention over the prior art is now readily apparent. The parallel and independent action of the front and rear work press assembly drastically decreases the handler's index time. The only time an integrated circuit is not being tested at test site 123 is when the work press assemblies move from turntable location 118 to the test site location 123. The time required to move between these two locations is about 0.8 seconds. A handler implemented with the present invention has an index time of approximately 0.8 seconds. The index time has been decreased from 3.2 seconds in the prior art to 0.8 seconds is in the present invention. A decrease in index time of approximately a factor of four. With a two second test time the total test cycle time is now about 2.8 seconds compared with the prior art 5.2 second cycle time. This represents a decrease of about 50% in total test cycle time. This allows twice as many parts to be tested in the same amount of time as were tested by the prior art handler.

A computer program can be provided to help with debugging a potential manufacturing problem. Sometimes the work press assemblies apply to much pressure to the integrated circuits during testing, resulting in the bending or breaking of the metal input/output leads of the integrated circuit. With the prior art, since there is only one work press assembly, one immediately knew which work press assembly was causing the problem. However, with the present invention since there are two different work press assemblies, it is not as easy to ascertain which work press is causing the problems. A computer program can, by monitoring the speed at which the work press assemblies pass from the up vertical position to the lowered vertical position, determine which of the two work presses is creating the problem. The computer program uses the electronic sensors to provide the time with which it takes the respective work press assemblies to move between the two positions. A work press which is moving too quickly is most likely the source of the problem. Such a computer program can be easily written in Z80 with well known programming techniques.

Thus, a novel apparatus and its method of operation for the fast and efficient parallel transfer of integrated circuits between locations has been described.

We claim:

1. An apparatus for the fast and efficient transfer of integrated circuits between three locations, a first input location, a second test site location, and a third output location, wherein each of said three locations reside in a first XY-plane comprising:
    a first work press assembly for transferring integrated circuits between said three locations and for applying pressure while the integrated circuits are being tested at said test site location, said first work assembly comprising:
        a variable length shaft;
        an arm rigidly coupled perpendicularly to said variable length shaft;
        a work press coupled to said arm;
    said first work press assembly capable of moving between three horizontal positions, a first position associated with said input location, a second position associated with said test site location, and a third position associated with said output location, said shaft of said first work press assembly located in a second plane whenever said work press assembly is in one of said three positions, said second plane substantially parallel to said first plane; and
    a second work press assembly for transferring integrated circuit between said locations and for applying pressure to integrated circuits while circuits are being tested at said test site location, said second work press assembly comprising:
        a variable length shaft;
        an arm rigidly coupled perpendicular to said variable length shaft;
        a work press coupled to said arm; said second work press assembly capable of moving between three horizontal positions, a first position associated with said input location, a second position associated with said test site location, and a third position associated with said output location, said variable length shaft of said second work press assembly located in a third plane whenever said second work press assembly is in one of said three positions, wherein said third plane is parallel to said first plane;
    said first work press assembly capable of moving from said third position associated with said output location to said first position associated with said input location while said second work press assembly is at said second position associated with said test site location, and said second work press assembly capable of moving from said third position associated with said output location to said first position associated with said input location while said first work press assembly is located at said second position associated with said test site location.

2. The apparatus of claim 1 wherein said variable length shafts of said first and second work press assemblies have at least a first and a second vertical length wherein said first length is shorter than said second length.

3. The apparatus of claim 1 wherein said variable length shafts are achieved with pneomatic cylinders.

4. The apparatus of claim 1 wherein said horizontal positions of said first and second work press assemblies are achieved with pneumatic cylinders.

5. The apparatus of claim 2 wherein said variable length shaft of said first work press assembly has said first vertical length and said variable length shaft of said second work press assembly has said second vertical length.

6. The apparatus of claim 2 wherein said variable length shaft of said second work press assembly has said first vertical length and said variable length shaft of said first work press assembly has said second vertical length.

7. An apparatus for the fast and efficient transfer of integrated circuits between four locations, a first load slide location, a turn table location, a test site location, and a second load slide location, wherein each of said four locations reside in a first XY plane comprising:
    a first work press assembly for transferring integrated circuits between said locations and for applying pressure to an integrated circuit while the integrated circuit is being tested at said test site location, said first work press assembly comprising:
a variable length shaft;
an arm rigidly coupled perpendicularly to said variable length shaft;
a work press coupled to said arm; said first work press assembly capable of moving between three horizontal positions, a first position associated with said turn table location, a second position associated with said test site location, and a third position associated with said second load slide location, said shaft of said first work press assembly located in a second plane whenever said work place assembly is in one of said three horizontal positions, said second plane substantially parallel to said first plane;
a second work press assembly for transferring integrated circuits between said locations and for applying pressure to an integrated circuit while said integrated circuit is being tested at said test site location, said second work press assembly comprising:
a variable length shaft;
an arm rigidly coupled perpendicularly to said variable length shaft;
a work press coupled to said arm;
said second work press assembly capable of moving between three horizontal positions, a first position associated with said turn table location, a second position associated with said test site location, and a third position associated with said second load slide location, said variable length shaft of said second work press assembly located in a third plane whenever said second assembly is one of said three horizontal positions, wherein said third plane is substantially parallel to said first plane;
said first work press assembly capable of moving from said third position associated with said second load slide location to said first position associated with said turntable location while said second work press assembly is at said position associated with said test site location, said second work press assembly capable of moving from said third position associated with said second load slide location to said position associated with said turn table location while said first work press assembly is located at said position associated with said test site location; and
a pick and place assembly for transferring said integrated circuit from said first load slide location to said turn table location, said pick and place comprising a shaft and a suction cup coupled to said shaft, said first pick and place assembly capable of moving to two horizontal positions, a first position associated with said first load slide location and a second position associated with said turn table location, said shaft of said pick and place assembly located in a fourth plane whenever said pick and place assembly is in one of said two positions, wherein said fourth plane is substantially parallel to said first plane.

8. The apparatus of claim 7 wherein said variable length shafts of said first and second work press assemblies have a first, a second, and a third vertical length.

9. The apparatus of claim 8 wherein said variable length shafts of said first and second work press assembly, each comprises a first and a second pneumatic cylinder coupled together wherein when both of said cylinders are closed, said shaft has said first length, and wherein when said first cylinder is open and said second cylinder is closed, said shaft has said second length, and wherein when said first cylinder is closed and said second cylinder is open said shaft has said third length.

10. The apparatus of claim 9 wherein said first pneumatic cylinder is an approximately 1.5 inch stroke cylinder, and said second pneumatic cylinder is an approximately 6 inch stroke cylinder.

11. The apparatus of claim 8 wherein when said first work press assembly moves from said third horizontal position associated with said second load slide location to said first horizontal position associated with said turn table location, said variable shaft of said first work press assembly has said first vertical length, and said second work press assembly has said third vertical length.

12. The apparatus of claim 8 wherein when said second work press assembly moves from said third horizontal position associated with said second load slide location to said first horizontal position associated with said turn table location, said variable shaft of said second work press assembly has said first vertical length, and said first work press assembly has said third vertical length.

13. The apparatus of claim 7 wherein said first work press assembly is moved to and from said horizontal positions by a first and a second pneumatic cylinder, and said second work press assembly is moved to and from said horizontal positions by a third and a fourth pneumatic cylinder.

14. The apparatus of claim 8 wherein three electronic sensors are provided for said first work press assembly and three electronic sensors are provided for said second work press assembly for detecting the vertical lengths of said variable length shafts of said first and second work press assemblies, and wherein three electronic sensors are provided for said first work press assembly and three electronic sensors are provided for said second work press assembly for detecting said horizontal positions of said first and said second work press assemblies, respectively.

15. The apparatus of claim 7 wherein said first and second work press assembly and said pick and place assembly are moved under control of a computer.

* * * * *

UNITED STATES PATENT AND TRADEMARK OFFICE
CERTIFICATE OF CORRECTION

PATENT NO. : 5,310,039
DATED : May 10, 1994
INVENTOR(S) : Richard R. Butera, et al It is certified that error appears in the above-indentified patent and that said Letters Patent is hereby corrected as shown below:

Column 2, line 3, delete "4", insert —40—.

Signed and Sealed this

Seventeenth Day of October, 1995

Attest:

BRUCE LEHMAN

*Attesting Officer*   *Commissioner of Patents and Trademarks*